United States Patent
Hailey et al.

(10) Patent No.: US 6,347,041 B1
(45) Date of Patent: Feb. 12, 2002

(54) INCREMENTAL PHASE CORRECTING MECHANISMS FOR DIFFERENTIAL SIGNALS TO DECREASE ELECTROMAGNETIC EMISSIONS

(75) Inventors: Jeffrey C. Hailey, Austin; William M. Simon, Round Rock, both of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/489,077

(22) Filed: Jan. 21, 2000

(51) Int. Cl.⁷ .............................. H05K 7/02; H05K 7/06
(52) U.S. Cl. ...................... 361/777; 174/250; 174/261; 333/12; 333/246; 333/247; 710/126
(58) Field of Search .................... 361/777; 174/250, 174/261; 333/12, 100, 246, 247; 257/664, 691; 710/126; 365/51, 63

(56) References Cited

U.S. PATENT DOCUMENTS

| | | | |
|---|---|---|---|
| 3,895,181 A | * 7/1975 | LaGrange et al. | 361/777 |
| 4,238,745 A | * 12/1980 | Schwarzmann | 333/246 |
| 4,383,227 A | * 5/1983 | De Ronde | 333/246 |
| 4,780,723 A | * 10/1988 | Mead | 333/246 |
| 4,879,433 A | * 11/1989 | Gillett et al. | 174/117 F |
| 5,386,344 A | * 1/1995 | Beaman et al. | 174/261 |
| 5,548,734 A | * 8/1996 | Kolinski et al. | 710/126 |
| 5,955,704 A | 9/1999 | Jones et al. | 174/262 |
| 6,072,699 A | * 6/2000 | Horine | 361/777 |
| 6,118,669 A | * 9/2000 | Yee et al. | 361/777 |
| 6,118,670 A | * 9/2000 | Radford et al. | 361/777 |
| 6,150,895 A | * 11/2000 | Steigerwald et al. | 333/12 |
| 6,208,219 B1 | * 3/2001 | Singer | 333/12 |
| 6,235,997 B1 | * 5/2001 | Asada et al. | 174/261 |
| 6,236,572 B1 | * 5/2001 | Teshome et al. | 361/794 |
| 6,239,985 B1 | * 5/2001 | Feraud et al. | 333/100 |
| 6,266,730 B1 | * 7/2001 | Perino et al. | 710/126 |

OTHER PUBLICATIONS

Abeye Teshome and Doug Wallace, Jr. "Controlled Impedance Bus and Method for a Computer System"; Feb. 4, 1999, U.S. Pat. Application No. 09/245,147. (Copy not enclosed.)
Mitchell Sebring, Todd Steigerwald, "Circuit Board Voltage Plane Impedance Matching"; Jan. 25, 1999; U.S. Pat. Application No. 09/236,706. (Copy not enclosed.)

* cited by examiner

Primary Examiner—Jeffery Gaffin
Assistant Examiner—John B. Vigushin
(74) Attorney, Agent, or Firm—Skjerven, Morrill MacPherson, LLP; Stephen A. Terrile

(57) ABSTRACT

A data processing system including but not limited to a section of a first printed-circuit-board conductive element, the section of the first printed-circuit-board conductive element formed to follow at least one bent segment of a first printed-circuit-board path; a section of a second printed-circuit-board conductive element, the section of the second printed-circuit-board conductive element having at least a first part formed to follow at least one bent segment of a second printed-circuit-board path, where the at least one bent segment of the second printed-circuit-board path is substantially proximate to and has a length less than a length of the at least one bent segment of the first printed-circuit-board path; and the section of the second printed-circuit-board conductive element having at least a second part formed to follow a conductive-section-equalization feature which deviates from the second printed-circuit-board path, the at least a second part situated substantially proximate to the at least one bent segment of the second printed-circuit-board path and of length sufficient to make a length of the section of the second printed-circuit-board conductive element substantially the same as a length of the section of the first printed-circuit-board conductive element.

42 Claims, 9 Drawing Sheets

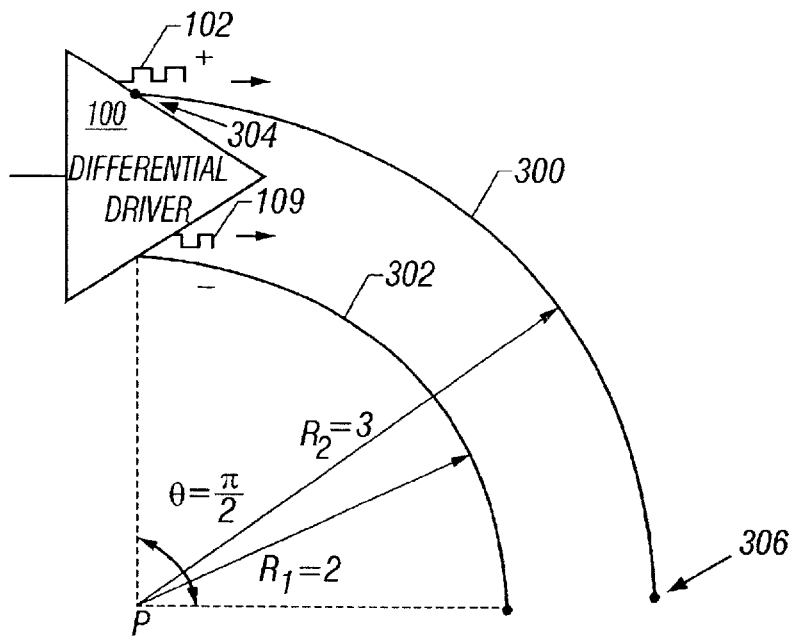

LENGTH OF TRACE 302 = $R_1 \cdot \dfrac{\pi}{2}$
$= \pi$

LENGTH OF TRACE 300 = $R_2 \cdot \dfrac{\pi}{2}$
$= \dfrac{3}{2}\pi$

SPEED OF ELECTRICAL ENERGY IN OUTER
TRACE OF PRINTED CIRCUIT BOARD
APPROXIMATELY $\approx 1(145 \times 10^{-12}$ SEC/INCH$)$
$\approx 6.897 \times 10^9$ INCH/SEC

TIME FOR WAVEFORM 104 TO REACH END OF TRACE 302

$\approx \pi$ INCHES $\times \dfrac{SEC}{6897 \times 10^9} \approx 455.3 \times 10^{-12}$ SEC

TIME FOR WAVEFORM 102 TO REACH END OF TRACE 300

$\approx \dfrac{3}{2}\pi$ INCHES $\times \dfrac{SEC}{6.897 \times 10^9} \approx 682.95 \times 10^{-12}$ SEC AT END OF TRACE 300 AND 302
⇨ WAVEFORM 102 LAGS WAVEFORM 104 BY $\approx 227.65 \times 10^{-12}$ SEC

*FIG. 3*

INCREMENTAL PHASE CORRECTING MECHANISMS FOR DIFFERENTIAL SIGNALS TO DECREASE ELECTROMAGNETIC EMISSIONS

BACKGROUND

1. Technical Field

This patent application relates, in general, to suppressing electromagnetic radiation in and around data processing systems.

2. Description of the Related Art

Data processing systems generally include electronic components (e.g., integrated circuits, resistors, capacitors, etc.) which are typically mounted on or integrated within printed circuit boards. A printed circuit board is a board made of non-conducting material, such as plastic, glass, ceramic, or some other dielectric on which electronic components are mounted. A printed circuit board has metallic tracings to provide electrical connections between various electronic components mounted on the printed circuit board.

During operation of a data processing system, one or more electronic components typically send electronic signals over one or more conductive paths (e.g., metallic traces) of one or more printed circuit boards. Such electronic signals often result in electromagnetic energy being radiated.

Electromagnetic radiation can interfere with data processing system operation (in which case the electromagnetic radiation is referred to as electromagnetic interference (EMI)). Accordingly, efforts are made within the art to suppress electromagnetic radiation emission from and around printed circuit boards and/or their associated electronic components.

One way in which electromagnetic radiation emissions are conventionally suppressed is via the use of what is known in the art as Low Voltage Differential Signaling (LVDS). LVDS is illustrated in FIG. 1.

With reference now to FIG. 1, shown is a partially schematic diagram depicting an example of LVDS via use of differential driver 100 which is contained within one or more printed circuit board 550. Illustrated is that differential driver 100 produces first voltage waveform 102, shown for sake of example as a square wave ranging between 0 and +5 volts which typically would have a period of around 2 nano-seconds (e.g., a 500 MHz waveform, very commonly used in microprocessor systems, has a period of $2\times10^{-9}$ seconds), on first printed-circuit-board trace 104. Also shown is that second voltage waveform 106, which is depicted as an exact inverse of first voltage waveform 102, and which is illustrated for sake of example as a square wave ranging between 0 and −5 volts which also typically would have a period of around 2 nano-seconds (e.g., the period of a 500 MHz waveform), on second printed-circuit-board trace 108, which is the exact inverse of first voltage waveform 102 in voltage and which is exactly synchronized with first voltage waveform 102 in time.

There are at least two intents involved in LVDS. A first intent is to increase the accuracy of any data processing system in which LVDS is used, since the difference of the received signal will give a signal of twice the magnitude of either of the differential signals taken alone. For example, if second waveform 106 is subtracted from first waveform 102, resultant signal will be a square wave waveform of twice the magnitude of first voltage waveform 102.

A second intent of LVDS is to reduce the amount of electromagnetic energy radiated by voltage waveform 102 and voltage waveform 106. This is illustrated by resultant radiated energy graph 110. The intent of resultant radiated energy graph 110 is to show that at some distance from printed-circuit-board traces 104 and 108, the energies respectively radiated by voltage waveform 102 and 106 substantially cancel each other. While those skilled in art will recognize that the energies do not typically cancel to exactly zero as indicated by resultant radiated energy graph 110, those skilled in the art will appreciate that the cancellation LVDS does tend to be substantially effective.

There are certain instances, described below, in which the differential signals, or waveforms, used in LVDS get out of phase (i.e., become un-synchronized in time). Such a lack of synchronization can create radiated energy in a fashion such as that illustrated in FIG. 2.

Referring now to FIG. 2, depicted is differential driver 200, substantially analogous to differential driver 100, in which second waveform 206, output by differential driver 200 on first printed-circuit-board trace 208, is slightly out of phase (or time synchronization) with first waveform 202 output by differential driver 200 on second printed-circuit-board trace 204. Illustrated by resultant radiated energy graph 210 is that at some distance from printed-circuit-board traces 204 and 208 substantial energy is radiated by voltage waveform 202 and 206, in that the phase-mismatch, or time slipping, of one waveform in relation to the other indicates that they do not cancel each other.

There are numerous ways that initially time-synchronized LVDS signals can become un-synchronized (i.e., develop a phase differential) when traveling within separate printed-circuit-board traces. One example showing how initially time-synchronized LVDS signals can become un-synchronized is illustrated in FIG. 3.

With reference now to FIG. 3, illustrated is an example of how LVDS can get out of phase. Shown is differential driver 100 driving first and second printed circuit traces 300 and 302. Depicted are that printed circuit traces 300 and 302 are formed in circular arc fashion, about a point P, with a "radius," $R_1$, of about 2 units for inner trace 302 and a "radius," $R_2$, of about 3 units for outer trace 300, with the arc of printed circuit trace 302 arranged inside that of the arc of printed circuit trace 300. Here, theta, in radians is roughly $\pi/2$. Those skilled in the art will recognize that the formula for circular arc length is approximately $R*\theta$. Thus, the distance traveled by a signal on inner trace 302 is about $\pi/2$ units less than that traveled by a signal on outer trace 300. Consequently, insofar as that the electrical energy in both inner trace 302 and outer trace 300 travels at about the same velocity, signal 102 traveling on outer trace 300 will arrive at the endpoint of outer trace 300 time-delayed relative to signal 104 (initially time-synchronized with signal 102) traveling on inner trace 302. To illustrate this, shown in FIG. 1 is a sample calculation with units set to inches. The units are expressed in inches for ease of illustration, but those skilled in the art will recognize that in typical printed circuit boards, units of length are usually expressed in terms of "mils" (standing for thousandths of an inch). The calculation used in FIG. 3 essentially states that a distance, d, traveled by a point on an electromagnetic energy waveform (e.g., a point on a square wave) multiplied by (1/(velocity of the electromagnetic energy waveform in a particular medium)) equals the time it takes for the point on the electromagnetic waveform to traverse the distance d. Illustrated is that the different-length paths followed by inner trace 302 and outer trace 304 result in loss of time synchronization between signal 102 and 104, which will accordingly give rise to electromagnetic energy radiation analogous to that described in relation to FIG. 2.

In printed circuit board layout design, it is not uncommon for printed-circuit-board traces carrying paired LVDS signals to take slightly different paths, such as those illustrated in relation to FIG. 3 (albeit on a much smaller scale), along and through a printed circuit board. Such varying paths which quite often result in a phase difference between respectively paired LVDS waveforms. This fact has long been recognized, and it is conventional within the art to build in some architecture at the end of the trace taking the shorter path on and/or through the printed circuit board in order to delay the signal on the shorter path such that the signal on the longer path has a chance to "catch up" with the signal on the shorter path, thereby allowing the LVDS signals to be "differenced" to achieve one of the intended benefits of LVDS signaling. Examples of printed-circuit-board traces employing this technique are illustrated in FIG. 4.

Referring now to FIG. 4, shown are printed-circuit-board traces wherein the conventional approach of inserting a delay near the end of a printed-circuit-board trace to make up for different lengths traversed by LVDS signal is illustrated. Shown are printed-circuit-board trace pairs 402, 404, 406, and 408, where various implementations of the conventional technique are shown. With respect to printed-circuit-board trace pair 402, shown is lengthening trace segment 412, which delays the signal on printed-circuit-board trace 422 relative to the signal on printed-circuit-board trace 432, hopefully such that the signal on printed-circuit-board trace 422 and the signal on printed-circuit-board trace 432 can be brought back into time synchronization prior circuit termination point 460. Likewise shown are lengthening trace segments 414, 416, and 418 which respectively function for printed-circuit-board trace pairs 404, 406, and 408 in a fashion substantially analogous to that described for lengthening trace segments 414, 416, and 418. For example, lengthening trace segment 414 delays the signal on printed-circuit-board trace 424 relative to the signal on printed-circuit-board trace 434, lengthening trace segment 416 delays the signal on printed-circuit-board trace 426 relative to the signal on printed-circuit-board trace 436, and lengthening trace segment 418 delays the signal on printed-circuit-board trace 428 relative to the signal on printed-circuit-board trace 438.

It has been discovered by the inventors named herein that while conventional lengthening trace segments such as lengthening trace segments 412, 414, 416, and 418 can and do bring out-of-phase signals back into phase prior to delivery of the signals to the endpoint of printed-circuit-board traces, the use of such conventional lengthening trace segments allows significant radiated energy emissions to arise as signals on each trace making up a printed-circuit-board trace pair transit each trace prior to encountering the conventional lengthening trace segments. In addition, the inventors named herein have also discovered that conventional lengthening trace segments such as lengthening trace segments 412, 414, 416, and 418 also cause excessively high impedance.

In light of the foregoing-noted discoveries of the inventors named herein, it is apparent that a need exists for a method and system which will decrease the amount of radiated emissions and excessive impedance associated with the use of conventional lengthening trace segments, such as lengthening trace segments 412, 414, 416, and 418, to re-synchronize LVDS signals which have become un-synchronized.

Although the preceding discussion has referred to LVDS for ease of illustration, those having skill in the art will recognize that the foregoing discussion applies generally to virtually all types of "differential signaling," of which LVDS is merely one type. Examples of other types of differential signaling include but are not limited to the following: USB (Universal Serial Bus) signaling, IEEE-1394 signaling, Ethernet signaling, RS-422 signaling, RS-485 signaling, AGP (Accelerated Graphics Port) 4× signaling, and ECL (Emitter Coupled Logic) signaling. Accordingly, the remainder of the present application makes reference to "differential signaling" which is intended to be indicative of at least substantially all of the foregoing recited types of differential signaling.

SUMMARY

The inventors named herein have discovered a system and method which decrease the amount of radiated emissions and excessive impedance associated with the use of conventional methods and systems to re-synchronize signals which have become un-synchronized. Advantages of the system and method are described in more detail in the detailed description, below.

In one embodiment, the system includes but is not limited to a section of a first printed-circuit-board conductive element, the section of the first printed-circuit-board conductive element formed to follow at least one bent segment of a first printed-circuit-board path; a section of a second printed-circuit-board conductive element, the section of the second printed-circuit-board conductive element having at least a first part formed to follow at least one bent segment of a second printed-circuit-board path, where the at least one bent segment of the second printed-circuit-board path is substantially proximate to and has a length less than a length of the at least one bent segment of the first printed-circuit-board path; and the section of the second printed-circuit-board conductive element having at least a second part formed to follow a conductive-section-equalization feature which deviates from the second printed-circuit-board path, the at least a second part situated substantially proximate to the at least one bent segment of the second printed-circuit-board path and of length sufficient to make a length of the section of the second printed-circuit-board conductive element substantially the same as a length of the section of the first printed-circuit-board conductive element.

In one embodiment, a related method for manufacturing includes but is not limited to forming a section of a first printed-circuit-board conductive element to follow at least one bent segment of a first printed-circuit-board path; forming a section of a second printed-circuit-board conductive element to have at least a first part shaped to follow at least one bent segment of a second printed-circuit-board path, where the at least one bent segment of the second printed-circuit-board path is substantially proximate to and has a length less than a length of the at least one bent segment of the first printed-circuit-board path; and forming the section of the second printed-circuit-board conductive element to have at least a second part shaped to follow a conductive-section-equalization feature which deviates from the second printed-circuit-board path, the at least a second part situated substantially proximate to the at least one bent segment of the second printed-circuit-board path and of length sufficient to make a length of the section of the second printed-circuit-board conductive element substantially the same as a length of the section of the first printed-circuit-board conductive element.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of this patent application will become apparent in the non-limiting detailed description set forth below.

BRIEF DESCRIPTION OF THE DRAWINGS

The use of the same reference symbols in different drawings indicates similar or identical items.

FIG. 3 is differential driver 100 driving first and second printed circuit traces 300 and 302.

DETAILED DESCRIPTION

As mentioned above, the inventors named herein have discovered that use of conventional lengthening trace segments give rise to unwanted electromagnetic emissions from printed circuit boards. As a solution to this difficulty, the inventors named herein have discovered a device and process which will provide the functions associated with the use of conventional lengthening traces to re-synchronize un-synchronized signals, but with a reduction of electromagnetic emissions and impedance values typically associated with the use of such conventional lengthening traces. The invented method and system are described in relation to the following figures.

Whereas the related art re-synchronized signals by correcting for an aggregate difference in length between two printed-circuit-board traces, the inventors herein have discovered a system and method which re-synchronize signals by correcting differences in the paths traveled by printed-circuit-board conductive elements carrying signals substantially local to where individual differences arise within the paths traveled by the printed-circuit-board traces. This is achieved by noting where the paths followed by the printed-circuit-board conductive elements bend and inserting a conductive-element-equivalence feature as near as practicable to the shorter bent element, where the conductive-element-feature has length sufficient to compensate for the difference in path lengths introduced by the bend.

Figure 1:
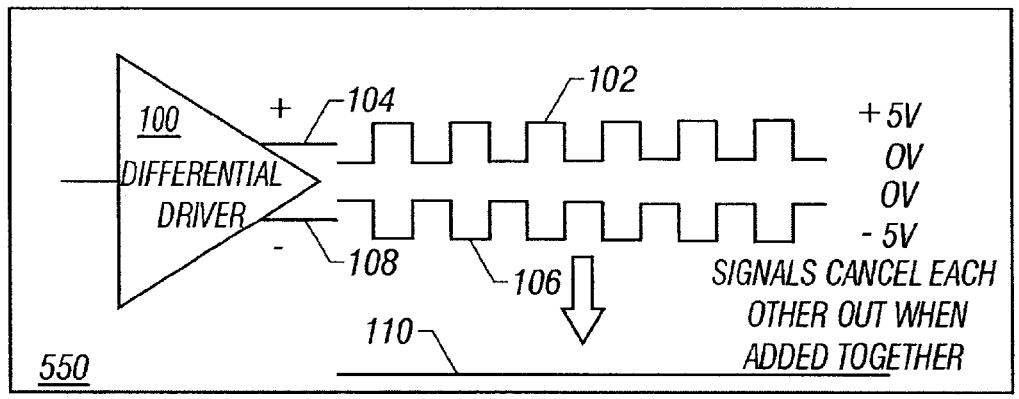
FIG. 1 is a partially schematic diagram depicting an example of via use of differential driver 100 which is contained within printed circuit board 550.
Figure 2:
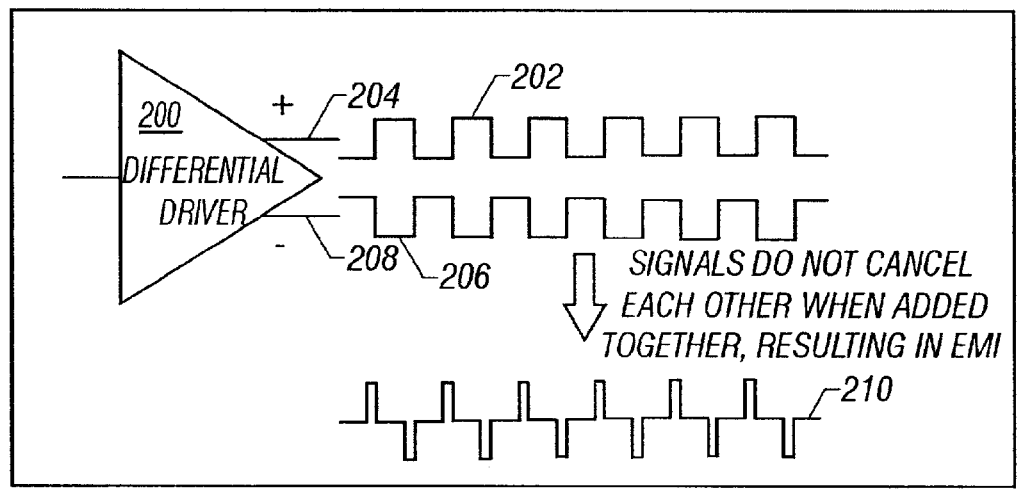
FIG. 2 is differential driver 200, substantially analogous to differential driver 100, in which second waveform 206, output by differential driver 200 on first printed-circuit-board trace 208, is slightly out of phase (or time synchronization) with first waveform 202 output by differential driver 200 on second printed-circuit-board trace 204.
Figure 4:
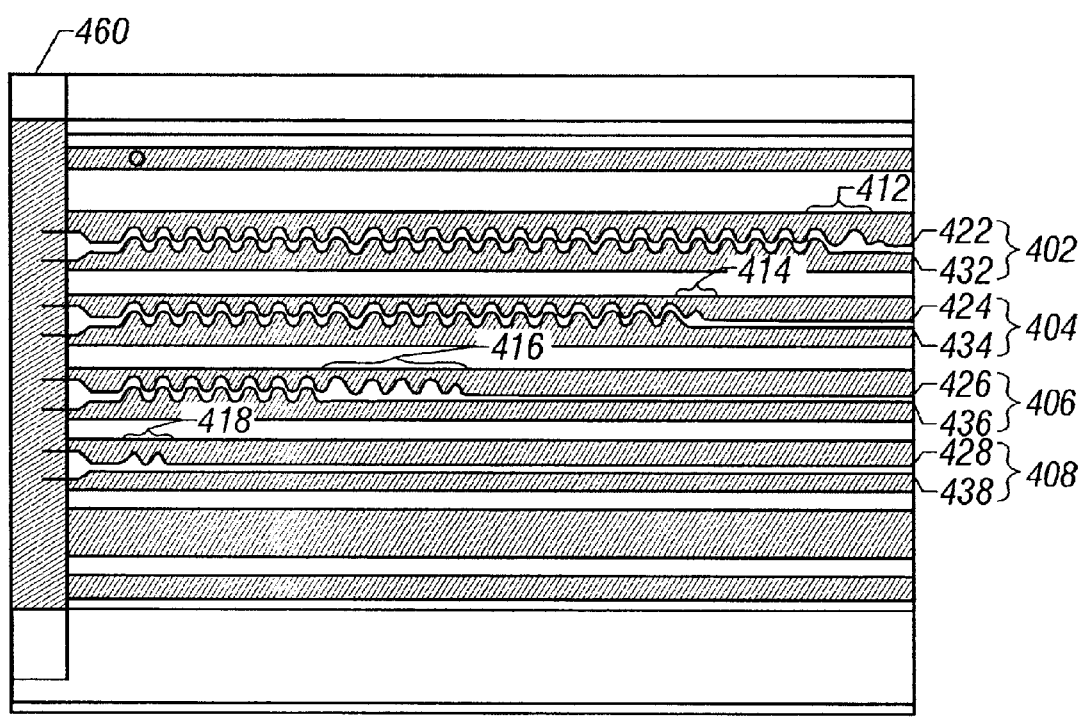
FIG. 4 illustrates printed-circuit-board traces wherein the conventional approach of inserting a delay near the end of a printed-circuit-board trace to make up for different lengths traversed by signal is illustrated.
Figure 5:
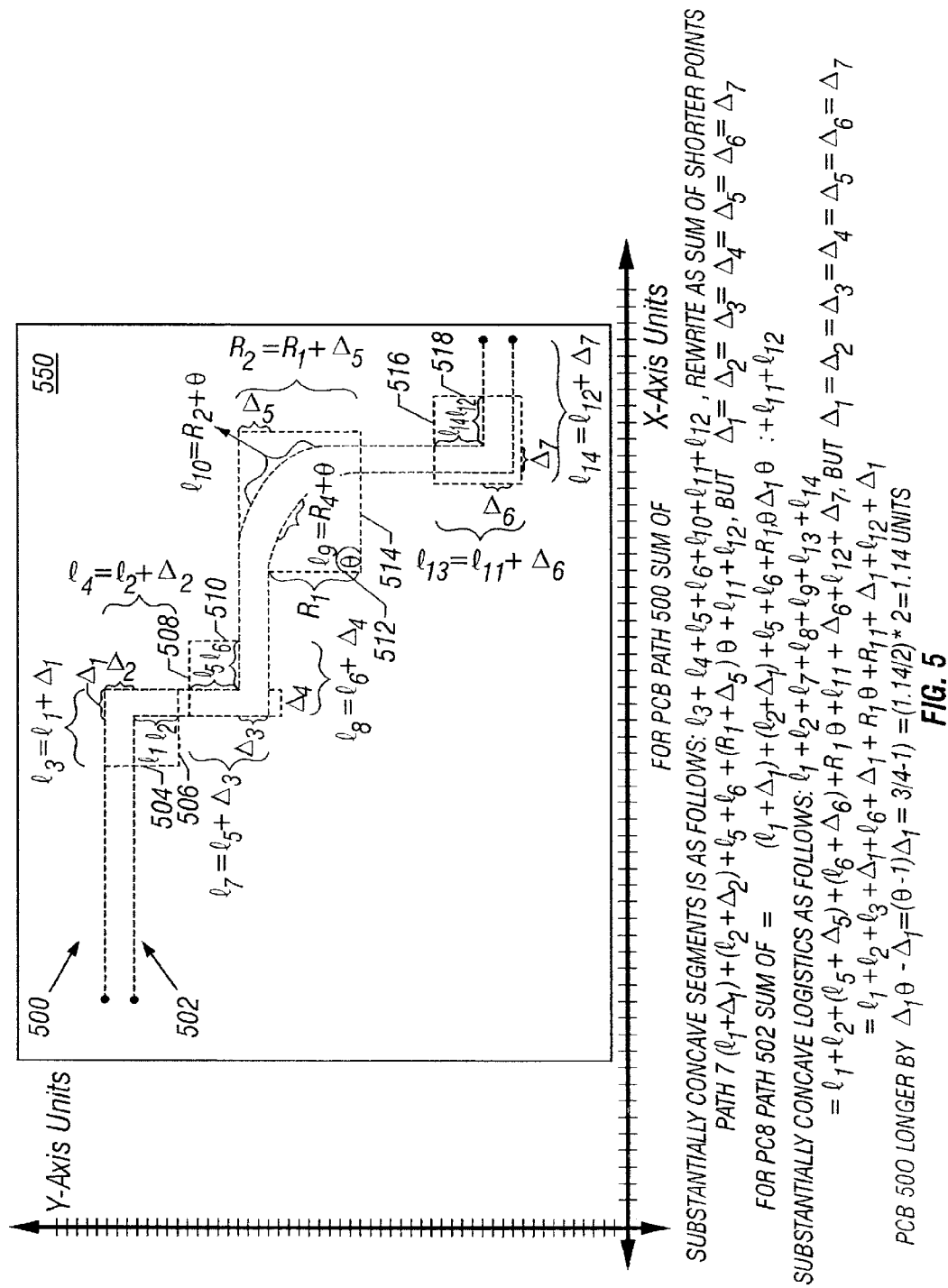
FIG. 5 illustrates printed circuit board 550 having printed-circuit-board paths 500 and 502.

Referring now to FIG. 5, depicted is printed circuit board 550 having printed-circuit-board paths 500 and 502. Shown are start-segment line 504 and end-segment line 506 both of which extend perpendicularly from printed circuit path 500 and which define what will be referred to herein as a bent segment of printed circuit path 500 and what will be referred to herein as a bent segment of printed circuit path 502, where such "bent segments" are used to bracket at least one bend (such that at least one bend can be in any direction in 3 dimensional space) in printed circuit path 500 and printed circuit path 502. As used herein, a "bend" in a printed circuit path is where the printed circuit path deviates from a straight line or position, such as where the printed circuit path assumes a curved, crooked, or angular form or direction. Exactly how far out from a bend the start-segment and end-segment lines extend is a design choice. In addition, although used herein for sake of illustration, such lines do not actually appear on the surface of printed-circuit-board 550, but are rather used as a construct to determine localized regions where printed-circuit-board path 500 and 502 vary in length.

Illustrated is that the first bent segment, defined by start-segment line 504 and end-segment line 506, of printed circuit path 502 has length $(l_1+l_2)$ less than that of the first bent segment, defined by start-segment line 504 and end-segment line 506, of printed circuit path 500 $(l_2+l_3$, or $(l_1+\Delta_1)+(l_2+\Delta_2))$.

Depicted are start-segment line 508 and end-segment line 510 both of which extend perpendicularly from printed circuit path 502 and which define a bent segment of printed circuit path 500 and a bent segment of printed circuit path 502. Illustrated is that the bent segment, defined by start-segment line 508 and end-segment line 510, of printed circuit path 500 has length $(l_5+l_6)$ less than that of the bent segment, defined by start-segment line 508 and end-segment line 510, of printed circuit path 502 $(l_7+l_8$, or $(l_5+\Delta_3)+(l_6+\Delta_4))$.

Illustrated are start-segment line 512 and end-segment line 514 both of which extend perpendicularly from printed circuit path 500 and which define a bent segment of printed circuit path 500 and a bent segment of printed circuit path 502. Shown is that the bent segment, defined by start-segment line 512 and end-segment line 514, of printed circuit path 502 has length $(l_9=R_1*\theta)$ less than that of the bent segment, defined by start-segment line 512 and end-segment line 514, of printed circuit path 500 $((R_2*\theta)$, or $(R_1+\Delta_5)*\theta))$ Shown are start-segment line 516 and end-segment line 518 both of which extend perpendicularly from printed circuit path 502 and which define a bent segment of printed circuit path 502 and a bent segment of printed circuit path 500. Shown is that the bent segment, defined by start-segment line 516 and end-segment line 518, of printed circuit path 500 has length ($l_{11}+l_{12}$) less than that of the bent segment, defined by start-segment line 516 and end-segment line 518, of printed circuit path 502 ($l_{13}+l_{14}$, or ($l_{11}+\Delta_6$)+($l_{12}+\Delta_7$)).

FIG. 5 is drawn substantially to scale in accordance with shown x-axis and y-axis units. Accordingly, if printed-circuit-board path 500 and printed-circuit-board path 502 were respectively overlaid with printed-circuit-board traces, and two initially time synchronized signals were injected into those respectively overlaid printed-circuit-board traces, within the segments of the traces overlaying the bent segments defined by start-segment 504 and end-segment 506, the signal on the trace overlying printed-circuit-board path 502 would appear to race ahead of the signal on the trace overlying printed-circuit-board path 500, which would result in un-synchronization of the signals thus resulting in increase electromagnetic radiation. The signals would thus travel un-synchronized and radiating until the signals arrived at the segments of the traces overlaying the bent segments defined by start-segment 508 and end-segment 510, wherein the signal on the trace overlying printed-circuit-board path 502 would travel a longer distance thereby allowing the signal traveling on the trace overlying printed-circuit-board path 500 to catch up, thereby re-synchronizing the signals and decreasing emission of electromagnetic radiation. The signals would thereafter travel in synchronized fashion until the signals arrived at the segments of the traces overlaying the bent segments defined by start-segment 512 and end-segment 514, wherein the signal on the trace overlying printed-circuit-board path 502 would appear to race ahead of the signal on the trace overlying printed-circuit-board path 500, which would result in un-synchronization of the signals thus resulting in increase electromagnetic radiation. Thereafter, the signals would thus travel un-synchronized and radiating until the signals arrived at the segments of the traces overlaying the bent segments defined by start-segment 516 and end-segment 518, wherein the signal on the trace overlying printed-circuit-board path 502 would travel a longer distance thereby allowing the signal traveling on the trace overlying printed-circuit-board path 500 to begin to catch up which would bring the signal closer to re-synchronization. However, insofar as it can be determined (as shown on FIG. 5) that the length of printed-circuit-board path 502 is 1.14 units longer than printed circuit-bard path 500, it can be deduced that the signals will not be completely re-synchronized and thus will continue to radiate at they transit through the printed-circuit-board traces overlaying the bent segments defined by start-segment 516 and end-segment 518.

As was noted in the discussion of related art section above, the related art solution to the noted aggregate length differential of 1.14 units is to insert a delaying trace near the end of a trace overlying with printed-circuit-board path 502 of length sufficient to delay the signal in that trace enough to allow the signal on the trace overlying printed-circuit-board 500 to "catch up" so that the signals are thus re-synchronized. While this related-art solution would result in time synchronization of signals at the end-points of printed-circuit-board traces respectively overlying printed-circuit-board paths 500 and 502, this related art solution does not take into account or minimize the emitted radiation associated with sections of printed-circuit-board traces overlying the bent segments of printed-circuit-board paths 500 and 502 described above. The inventors named herein have devised a method and system which provide both the time synchronization functions of the related art solution and substantially minimize the amount of radiated emissions associated with the bent segments of printed-circuit-board paths 500 and 502.

Figure 6:
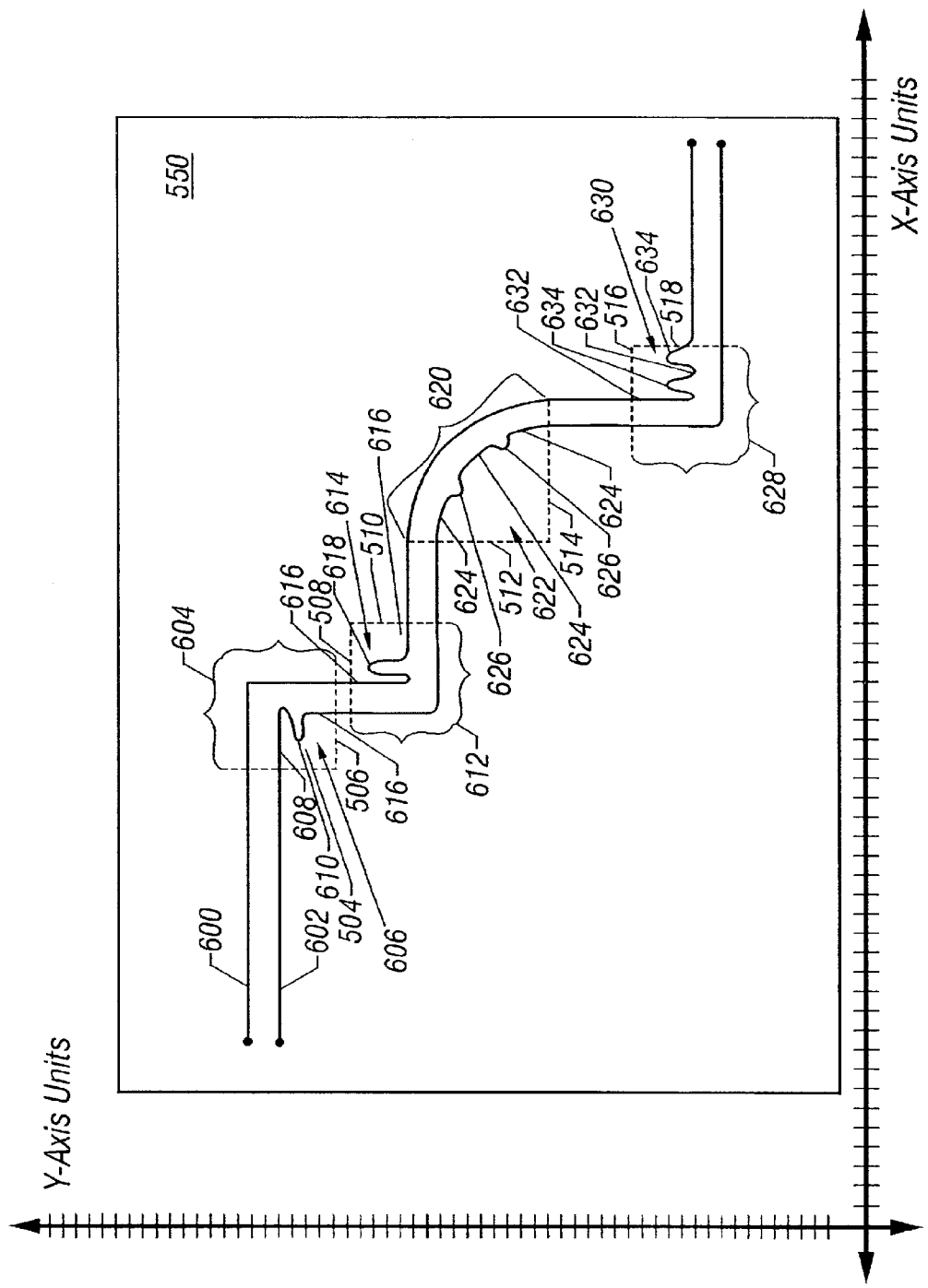
FIG. 6 illustrates printed circuit board 550 having printed-circuit-board trace 600 substantially overlaid onto printed-circuit board path 500 (which exists, but is not shown here in FIG. 6 for sake of clarity) and printed-circuit-board trace 602 substantially overlaid onto printed-circuit board path 502 (which exists, but is not shown here in FIG. 6 for sake of clarity), where the term "substantially overlaid" means that printed-circuit-board trace 600 tends to follow printed-circuit board path 500 and that printed-circuit-board trace 602 tends to follow printed-circuit board path 502 except for certain defined regions, discussed below.

Referring now to FIG. 6, illustrated is printed circuit board 550 having printed-circuit-board trace 600 substantially overlaid onto printed-circuit-board path 500 (which exists, but is not shown here in FIG. 6 for sake of clarity) and printed-circuit-board trace 602 substantially overlaid onto printed-circuit-board path 502 (which exists, but is not shown here in FIG. 6 for sake of clarity), where the term "substantially overlaid" means that printed-circuit-board trace 600 tends to follow printed-circuit-board path 500 and that printed-circuit-board trace 602 tends to follow printed-circuit board path 502 except for certain defined regions, discussed below.

Shown is printed-circuit-board-trace section 604 formed to follow the bent segment, defined by start-segment line 504 and end-segment line 506, of printed-circuit-board path 500. Depicted is printed-circuit-board-trace section 606 which has parts 608 formed to follow the bent segment, defined by start-segment line 504 and end-segment line 506, of printed-circuit-board path 502, and part 610 formed to follow a "trace-equalization feature," which has length sufficient to ensure that the length of the printed-circuit-board-trace section 606 is substantially the same as the length of printed-circuit-board-trace section 604. That is, the trace-equalization feature is of length sufficient to ensure that the lengths of the printed-circuit-board trace sections within the region defined by start-segment line 504 and end-segment line 506 are substantially equal. The size of part 610 is a design choice constrained only by the requirement that the length of any part 610 does not exceed ¼*$\lambda$, where $\lambda$ is calculated using equation 1, below. Although only one part 610 is shown, it is to be understood that more than one part 610 can be formed and that each such part 610 can follow a trace-equalization feature having a different shape and length, where the sum of the lengths of each individual part 610 would be such to ensure that in the aggregate the lengths of the printed-circuit board trace sections within the region defined by start-segment line 504 and end-segment line 506 are substantially equal.

Depicted is printed-circuit-board-trace section 612 formed to follow the bent segment, defined by start-segment line 508 and end-segment line 510, of printed-circuit-board path 502. Depicted is printed-circuit-board-trace section 614 which has parts 616 formed to follow the bent segment, defined by start-segment line 508 and end-segment line 510, of printed-circuit-board path 500, and part 618 formed to follow a "trace-equalization feature," which has length sufficient to ensure that the length of the printed-circuit-board-trace section 614 is substantially the same as the length of printed-circuit-board-trace section 612. That is, the trace-equalization feature is of length sufficient to ensure that the lengths of the printed-circuit-board trace sections within the region defined by start-segment line 508 and end-segment line 510 are substantially equal. The size of part 618 is a design choice constrained only by the requirement that the length of any part 610 does not exceed ¼*$\lambda$, where $\lambda$ is calculated using equation 1, below. Although only one part 618 is shown, it is to be understood that more than one part 618 can be formed and that each such part 618 can follow a trace-equalization feature having a different shape and length, where the sum of the lengths of each individual part 618 would be such to ensure that in the aggregate the lengths of the printed-circuit board trace sections within the region defined by start-segment line 508 and end-segment line 510 are substantially equal.

Illustrated is printed-circuit-board-trace section 620 formed to follow the bent segment, defined by start-segment line 512 and end-segment line 514, of printed-circuit-board path 500. Depicted is printed-circuit-board-trace section 622 which has parts 624 formed to follow the bent segment, defined by start-segment line 512 and end-segment line 514, of printed-circuit-board path 502, and to parts 626 each formed to follow a "trace-equalization feature" where each trace equalization feature has length sufficient to ensure that the length of printed-circuit-board-trace sections 622 and 620 are kept substantially the same throughout the entire length of printed-circuit-board-trace section 620. The spacing, size, and number of parts 626 are design choices constrained only by the requirement that the length of any part 626 does not exceed ¼*λ, where λ is calculated using equation 1, below.

Shown is printed-circuit-board-trace section 628 formed to follow the bent segment, defined by start-segment line 516 and end-segment line 518, of printed-circuit-board path 502. Depicted is printed-circuit-board-trace section 630 which has parts 632 formed to follow the bent segment, defined by start-segment line 516 and end-segment line 518, of printed-circuit-board path 500, and parts 634 each of which is formed to follow a "trace-equalization feature," where each trace-equalization-feature has length sufficient to ensure that in the aggregate the length of the printed-circuit-board-trace section 632 is substantially the same as the length of printed-circuit-board-trace section 628. The spacing, size, and number of parts 634 are design choices constrained only by the requirement that the length of any part 634 does not exceed ¼*λ, where λ is calculated using equation 1, below. That is even though only two parts 634 are shown, it is to be understood that more than two parts 634 can be formed and that each such part 634 can follow a trace-equalization feature having a different shape and length, where the sum of the lengths of each individual part 634 would be such to ensure that the aggregate lengths of the printed-circuit board trace sections within the region defined by start-segment line 516 and end-segment line 518 are substantially equal.

While the foregoing has shown all trace-equalization features as smooth curves, it will be appreciated that such could also be formed in zigzag, wavelike, or bent patterns.

Figure 7:
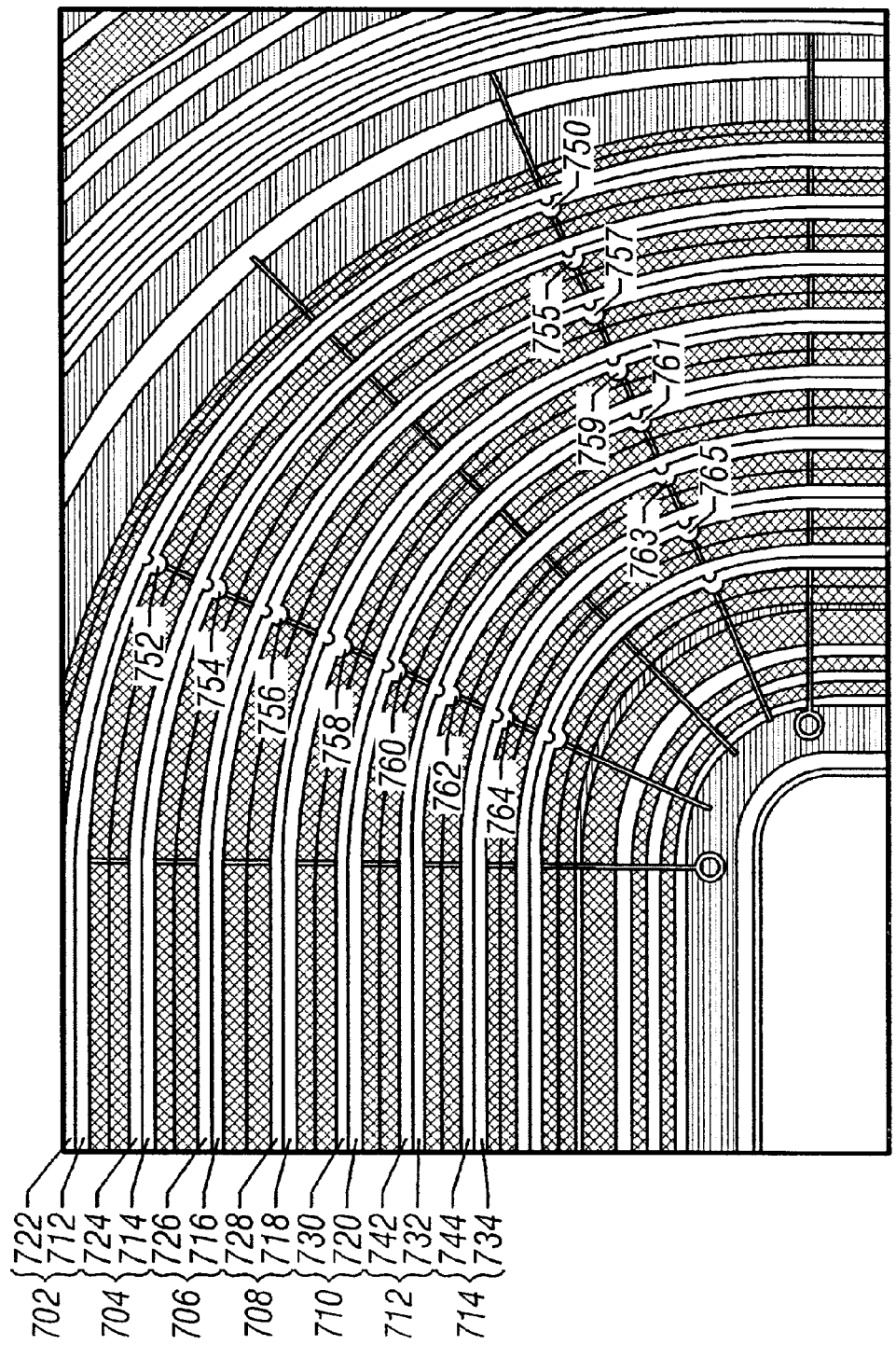
FIG. 7 illustrates embodiments of printed-circuit-board trace pairs wherein trace-equalization features have been added to the shorter (or inner) traces making up the trace pairs.

Referring now to FIG. 7, depicted are embodiments of printed-circuit-board trace pairs wherein trace-equalization features have been added to the shorter (or inner) traces making up the trace pairs. Printed-circuit-board trace pair 702 is shown composed of inner trace 712 and outer trace 722, where inner trace 712 has trace-equalization features 752 and 753 which are so formed to equalize the length of inner trace 712 and outer trace 722 in the vicinity of trace-equalization features 752 and 753.

Printed-circuit-board trace pair 704 is shown composed of inner trace 714 and outer trace 724, where inner trace 714 has trace-equalization features 754 and 755 which are so formed to equalize the length of inner trace and outer trace in the vicinity of trace-equalization features 754 and 755.

Printed-circuit-board trace pair 706 is shown composed of inner trace 716 and outer trace 726, where inner trace 716 has trace-equalization features 756 and 757 which are so formed to equalize the length of inner trace and outer trace in the vicinity of trace-equalization features 756 and 757.

Printed-circuit-board trace pair 708 is shown composed of inner trace 718 and outer trace 728, where inner trace 718 has trace-equalization features 758 and 759 which are so formed to equalize the length of inner trace and outer trace in the vicinity of trace-equalization features 758 and 759.

Printed-circuit-board trace pair 710 is shown composed of inner trace 720 and outer trace 730, where inner trace 720 has trace-equalization features 760 and 761 which are so formed to equalize the length of inner trace and outer trace in the vicinity of trace-equalization features 760 and 761.

Printed-circuit-board trace 712 is shown composed of inner trace 732 and outer trace 742, where inner trace 732 has trace-equalization features 762 and 763 which are so formed to equalize the length of inner trace and outer trace in the vicinity of trace-equalization features 762 and 763.

Printed-circuit-board trace 714 is shown composed of inner trace 734 and outer trace 744, where inner trace 734 has trace-equalization features 764 and 765 which are so formed to equalize the length of inner trace and outer trace in the vicinity of trace-equalization features 764 and 765.

While only two trace-equalization features discussed above are shown on each inner trace, it is to be understood that more or less than two traces could be used. In addition, the illustration of FIG. 7 is intended to be illustrative of any printed-circuit-board trace wherein pairs are utilized and wherein bends in the pairs give rise to slightly different lengths on an inner arc (or corner, or bend) trace and an outer arc trace.

Figure 8:
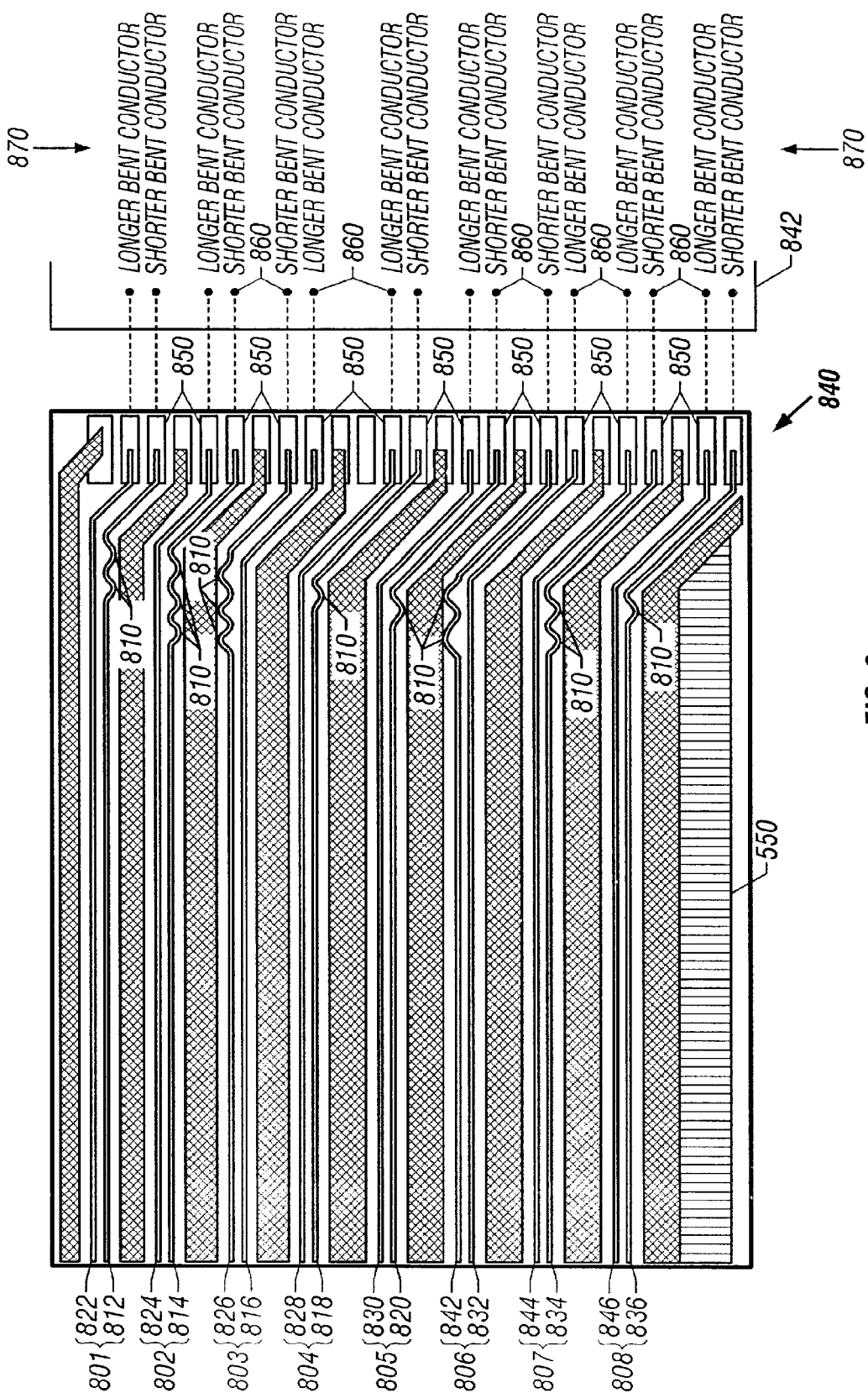
FIG. 8 illustrates printed circuit board 550 having board-edge connector 840 having fingerpads 850 which, when board edge connector 840 is inserted into board-edge connector socket 842 (shown in transparent view) respectively interface with board-edge connector wipers 860 respectively connected with connector conductors (typically copper wires) contained within a board-edge connector socket 842.

Referring now to FIG. 8, illustrated is printed circuit board 550 having board-edge connector 840 having finger-pads 850 which, when board edge connector 840 is inserted into board-edge connector socket 842 (shown in transparent plan view) respectively interface with board-edge connector wipers 860 respectively connected with connector conductors (typically copper wires) contained within a board-edge connector socket 842. Depicted is that board-edge connector wipers 860 respectively connect with connector conductors 870. Because of the way in which connector conductors 870 within board edge connector socket 842 are arranged and/or because of the way in which the connector conductors 870 within board-edge connector socket 842 interface with other printed-circuit-board conductors (not shown) which board-edge connector socket 842 is to connect with fingerpads 850, for each pair of connector conductors 870 utilized to carry signals (e.g., pair ultimately electrically connected with printed-circuit-board trace pair 801), the individual respective connector conductors making up the pair will typically follow two different length paths in connecting a pair of printed-circuit-board traces of a second printed-circuit-board(not shown) to the printed-circuit-board traces pairs 801–808 on printed-circuit-board 550. The two different length paths arise because one of the paired connector conductors follows a path through space that forms part a printed-circuit-board path (since the connector is connecting two circuit-boards we can treat the connector conductors as forming part of a printed-circuit-board path) which has a different substantial bending (i.e., different bending or curving) than that followed by the other conductor making up the pair. Consequently, such different substantial bends will form a length difference analogous to those discussed in relation to FIG. 5, above.

The difference in length is primarily due to the different paths followed by various pairs of connector conductors 870. However, insofar as that the board-edge connector sockets are typically manufactured to industry standards, it is typically not practicable to correct the length mismatch internal to the board-edge connector sockets. Accordingly, shown is that the length mismatch is corrected via forming one or more conductor-connector equalization features 810 in whichever printed-circuit-board trace making up a printed-circuit-board trace pair that ultimately electrically connects with a shorter one of paired connector conductors 870.

Depicted are printed-circuit-board trace pairs 801–808. Printed-circuit-board trace pair 801 is shown composed of first trace 812 and second trace 822, where first trace 812 has a first connector-conductor-equalization feature 810 and a second connector-conductor-equalization feature 810 which are so formed to correct the length imbalance introduced by the longer connector conductor which will be connected with second trace 822.

Printed-circuit-board trace pair 802 is shown composed of first trace 814 and second trace 824, where first trace 814 has a first connector-conductor-equalization feature 810, a second connector-conductor-equalization feature 810, and a third connector-conductor-equalization feature 810 which are formed for substantially the same reasons discussed in relation to printed-circuit-board trace pair 801 (i.e., to correct the length imbalance introduced by the longer connector conductor which will connect with second trace 824).

Printed-circuit-board trace pair 803 is shown composed of first trace 816 and second trace 826, where second trace 826 hasa first connector-conductor-equalization feature 810, a second connector-conductor-equalization feature 810, and a third connector-conductor-equalization feature 810 which are formed for substantially the same reasons discussed in relation to printed-circuit-board trace pair 801 (i.e., to correct the length imbalance introduced by the longer connector conductor which will connect with first trace 816).

Printed-circuit-board trace pair 804 is shown composed of first trace 818 and second trace 828, where first trace 818 has a first connector-conductor-equalization feature 810 which is formed for substantially the same reason discussed in relation printed-circuit-board trace pair 801 (i.e., to correct the length imbalance introduced by the longer connector conductor which will connect with second trace 828).

Printed-circuit-board trace pair 805 is shown composed of first trace 820 and second trace 830, where first trace 820 has a first connector-conductor-equalization feature 810 which is formed for substantially the same reason discussed in relation to printed-circuit-board trace pair 801 (i.e., to correct the length imbalance introduced by the longer connector conductor which will connect with second trace 830).

Printed-circuit-board trace pair 806 is shown composed of first trace 832 and second trace 842, where second trace 842 has a first connector-conductor-equalization feature 810, and a second connector-conductor-equalization feature 810 which are formed for substantially the same reasons discussed in relation to printed-circuit-board trace pair 803 (i.e., to correct the length imbalance introduced by the longer connector conductor which will connect with first trace 832).

Printed-circuit-board trace pair 807 is shown composed of first trace 834 and second trace 844, where first trace 834 has a first connector-conductor-equalization feature 810 and a second connector-conductor-equalization feature 810 which are so formed to correct the length imbalance introduced by the longer connector conductor which will be connected with second trace 844.

Printed-circuit-board trace pair 808 is shown composed of first trace 836 and second trace 846, where first trace 836 has a first connector-conductor-equalization feature 810 which is formed for substantially the same reason discussed in relation to printed-circuit-board trace pair 802 (i.e., to correct the length imbalance introduced by the longer connector conductor which will connect with second trace 846).

While the foregoing has shown all connector-conductor-equalization features as smooth curves, it will be appreciated that such could also be formed in zigzag, wavelike, or bent patterns.

FIGS. 5, 6, 7, and 8 have illustrated trace- and connector-conductor equalization features incorporated into printed-circuit-board trace sections. With respect to how long those illustrated trace- and connector-conductor-equalization traces should be, the length of the discontinuity of any one trace- or connector-conductor-equalization feature should be less than $\lambda/4$, where $\lambda$ given by the following equation:

$$\lambda = c \div (f \times \sqrt{\in_r})$$

where $\lambda$ is wavelength in meters, c is the speed of light in meters per second, f is the frequency of the waveform which is most likely to be used in exciting the printed circuit trace, and $\in_r$, is the relative dielectric constant, which is a constant that takes into account those situations in which a trace is exposed to two substances (e.g., fiberglass-epoxy board underneath a trace and air above the trace, when a printed-circuit-board trace is a surface trace). If the length of any lengthening trace exceeds $\lambda/4$, excessive reflections of electromagnetic energy tend to occur.

Figure 9:
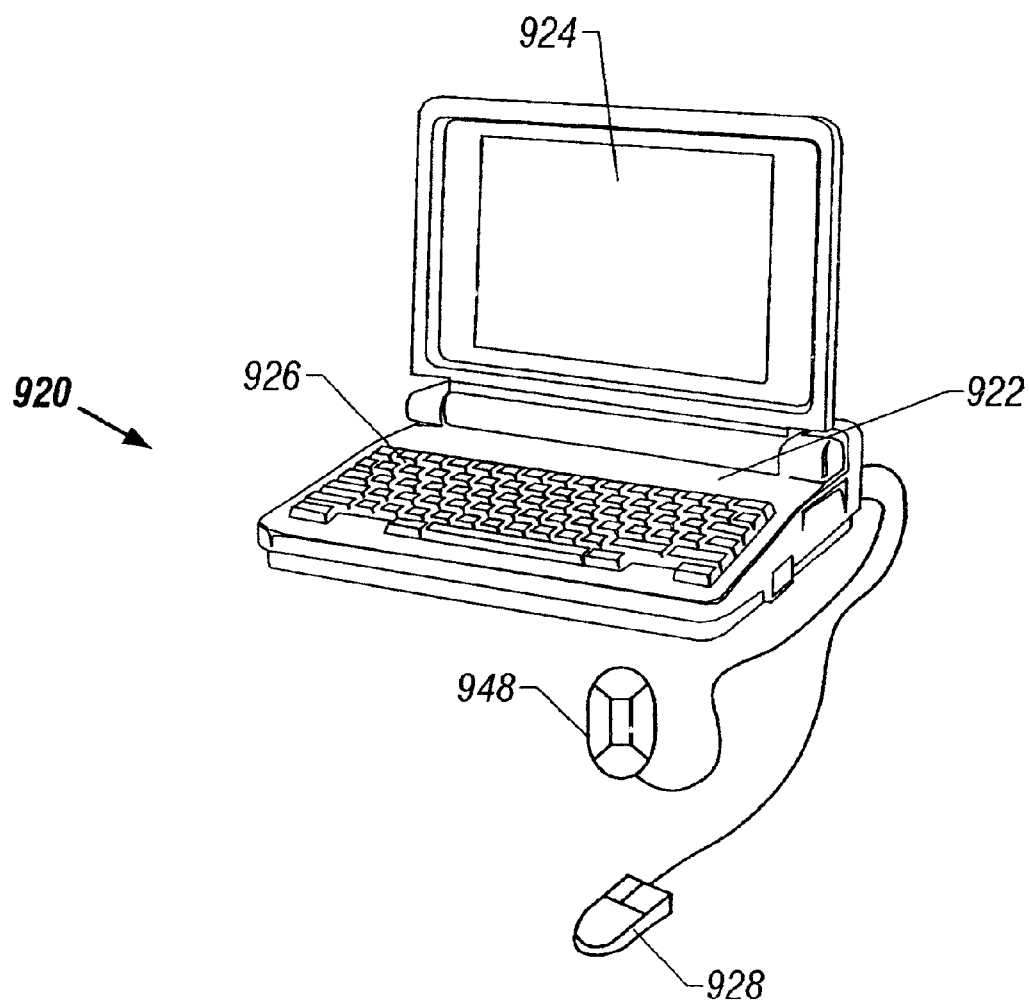
FIG. 9 illustrates a pictorial representation of a conventional data processing system which can be utilized in accordance with an illustrative embodiment of the printed-circuit-board traces described above.

With reference now to FIG. 9, depicted is a pictorial representation of a conventional data processing system which can be utilized in accordance with an illustrative embodiment of the printed-circuit-board traces described above. It should be noted that a graphical user interface systems (e.g., Microsoft Windows 98 or Microsoft Windows NT operating systems) and methods can be utilized with the data processing system depicted in FIG. 9. Data processing system 920 is depicted which includes system unit housing 922, video display device 924, keyboard 926, mouse 928, and microphone 948. Data processing system 920 may be implemented utilizing any suitable computer such as those sold by Dell Computer Corporation, located in Round Rock, Tex. Dell is a trademark of Dell Computer Corporation.

Figure 10:
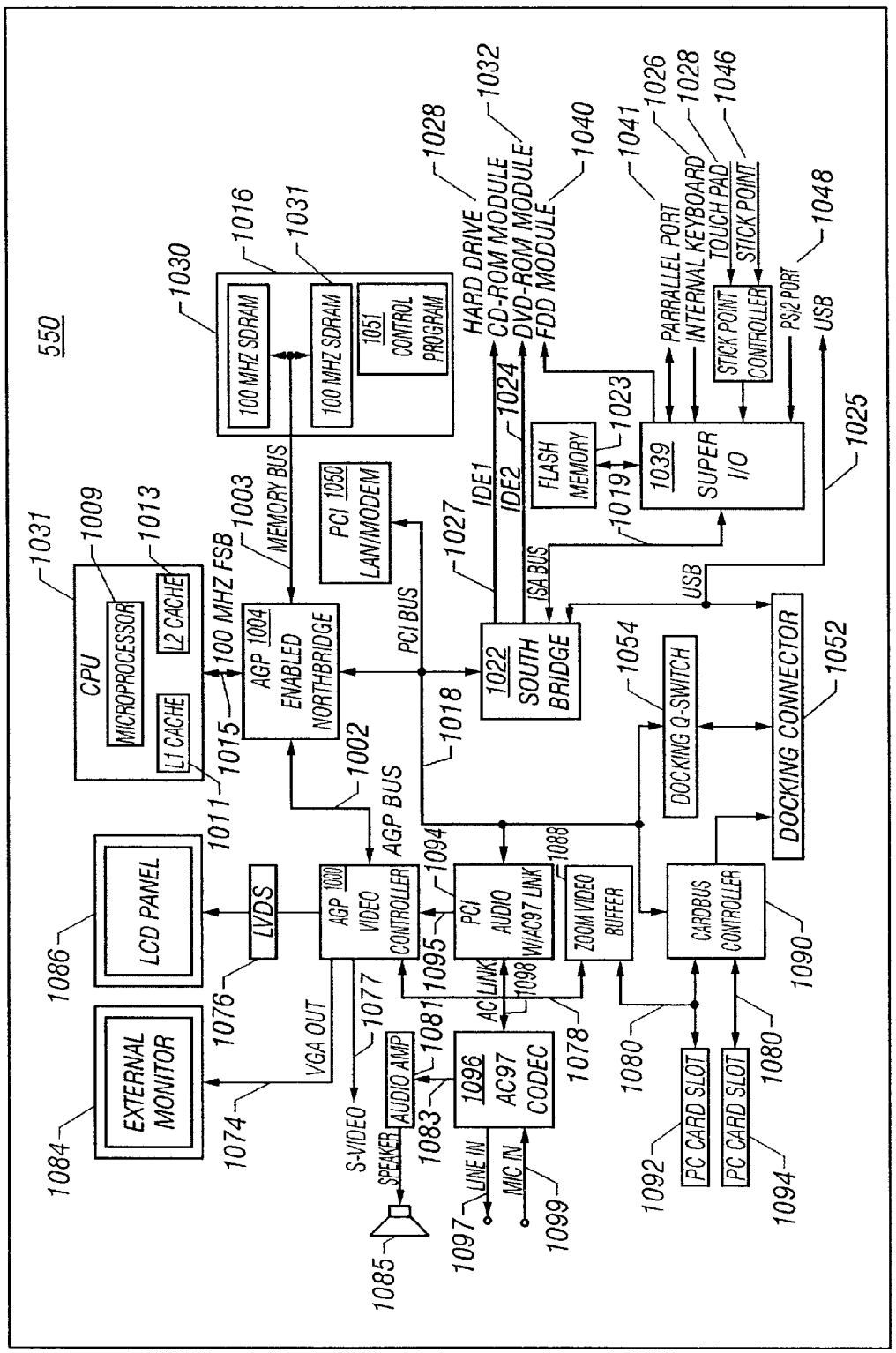
FIG. 10 illustrates motherboard 550 having selected components of data processing system 920 in which illustrative embodiments of the printed-circuit-board traces described above may be implemented (for example, by using printed-circuit-board traces described herein.

Referring now to FIG. 10, depicted is motherboard 550 having selected components of data processing system 920 in which illustrative embodiments of the printed-circuit-board traces described above may be implemented (for example, by using the embodiments described herein where traces carrying differential signaling signals bend). Data processing system 920 includes Central Processing Unit ("CPU") 1031 (wherein are depicted microprocessor 1009, L1 Cache 1011, and L2 Cache 1013). CPU 1031 is coupled to CPU bus 1015.

CPU bus 1015 is coupled to AGP-enabled Northbridge 1004, which serves as a "bridge" between CPU bus 1015, AGP interconnect (or bus) 1002 (a type of data bus), and system memory bus 1003. In going from one type of bus to another type of bus, a "bridge" is generally needed because the two different type buses speak a different "language." The term "AGP-enabled" is intended to mean that the so-referenced components are engineered such that they interface and function under the standards defined within the AGP interface specification (Intel Corporation, *Accelerated Graphics Port Interface Specification*).

Generally, each bus in a system utilizes an independent set of protocols (or rules) to conduct data, which are generally set forth in a product specification uniquely tailored to the type of bus in question (e.g., the PCI local bus specification and the AGP interface specification). These protocols are designed into a bus directly and such protocols are commonly referred to as the "architecture" of the bus. In a data transfer between different bus architectures, data being transferred from the first bus architecture may not be in a form that is usable or intelligible by the receiving second bus architecture. Accordingly, communication problems may occur when data must be transferred between different types of buses, such as transferring data from a PCI device on a PCI bus to a CPU on a CPU bus. Thus, a mechanism is developed for "translating" data that are required to be transferred from one bus architecture to another. This translation mechanism is normally contained in a hardware device in the form of a bus-to-bus bridge (or interface) through which the two different types of buses are connected. This is one of the functions of AGP-enabled Northbridge 1004, as well as the Southbridge 1022, in that it is to be understood that such bridges can translate and coordinate between various data buses and/or devices which communicate through the bridges.

AGP interconnect 1002 interfaces with AGP-enabled video controller 1000, which respectively interconnects with video display devices external monitor 1084 and LCD (Liquid Crystal Display) panel 1086 (each of which are specific illustrations of the more general video display device 924) through VGA (Video Graphics Array) out) 1074 and LVDS bus 1076 (which may be composed, at least in part, by a Flexible Printed Circuit having traces). AGP-enabled video controller 1000 also is depicted with S-Video out jack 1077. AGP-enabled video controller 1000 also is depicted as interconnected with zoom video buffer 1088 via zoom video buffer bus 1078. Zoom video buffer 1088 is illustrated as interconnected with cardbus controller 1090 via cardbus controller lines 1080. Shown is that Cardbus controller lines 1080 connect Cardbus controller 1090 with PCI card slots 1092 and 1094.

Shown is that AGP-enabled video controller 1000 interconnects with PCI audio w/AC97 link 1094 via PCI audio-AGP video bus 1095. Depicted is that PCI audio w/AC97 link 1094 interconnects with AC97 CODEC 1096 via AC97 link 1098. Illustrated is that AC97 CODEC 1096 has line in jack 1097 and mic in jack 1099. Depicted is that AC97 CODEC 1096 interfaces with audio amp 1081 via AC97 CODEC-audio amp bus 1083. Illustrated is that audio amp 1081 drives speaker 1085.

AGP-enabled Northbridge 1004 interfaces with system memory bus 1003. System memory bus 1003 interfaces with system memory 1016, which can contain various types of memory devices such as SDRAM chips 1030 and 1031, but which also can contain DRAM, Rambus DRAM, and other type memory chips. In addition, shown for sake of illustration is that data processing system 920 includes control program 1051 which resides within system memory 1016 and which is executed and/or operated on by CPU 1031. Control program 1051 contains instructions that when executed on CPU 1031 carries out application program (e.g., videoconferencing software) operations.

AGP-enabled Northbridge 1004 interfaces with Peripheral Component Interconnect (PCI) bus 1018, upon which are shown PCI Input-Output (I/O) devices PCI LAN/modem card 1050, PCI Audio w/AC97 link 1094, cardbus controller 1090, and docking Q switch 1054 which is depicted as electrically connected with docking connector 1052. Docking connector 1052 is also shown electrically connected with cardbus controller 1090 and universal serial bus (USB) 1025.

Depicted is that Peripheral Component Interconnect (PCI) bus 1018 interfaces with Southbridge 1022.

Southbridge 1022 serves as a bridge between PCI bus 1018 and I/O (or ISA) bus 1019, universal serial bus USB 1025, and Integrated Drive Electronics (IDE)connectors 1027 and 1029, which respectively connect with hard drive CD-ROM module 1028 and DVD-ROM module 1032.

I/O bus 1019 interfaces with super I/O controller 1039. Further shown is that super I/O controller 1039 connects devices flash memory 1023, FDD (floppy disk drive) module 1040, parallel port 1041, internal keyboard 1026, mouse or touchpad 1028, stick point 1046, and PS/2 port 1048 to I/O bus 1019.

Data processing system 920 typically contains logic defining at least one graphical user interface, and any suitable machine-readable media may retain the graphical user interface, such as SDRAM 1030, ROM, a magnetic diskette, magnetic tape, or optical disk. Any suitable operating system such as one having an associated graphical user interface (e.g., Microsoft Windows or Microsoft NT) may direct CPU 1031. Other technologies can also be utilized in conjunction with CPU 1031, such as touch-screen technology or human voice control.

Those skilled in the art will appreciate that the hardware depicted in FIG. 10 may vary for specific applications. For example, other peripheral devices such as optical disk media, audio adapters, video cameras such as those used in videoconferencing, or programmable devices, such as PAL or EPROM programming devices well-known in the art of computer hardware, and the like may be utilized in addition to or in place of the hardware already depicted.

Those skilled in the art will recognize that data processing system 920 can be described in relation to data processing systems which perform essentially the same functions, irrespective of architectures.

The foregoing components and devices are used herein as examples for sake of conceptual clarity. Thus, CPU 1031 is utilized as an exemplar of any general processing unit, including but not limited to multiprocessor units; CPU bus 1015 is utilized as an exemplar of any processing bus, including but not limited to multiprocessor buses; PCI devices attached to PCI bus 1018 are utilized as exemplars of any input-output devices attached to any I/O bus; AGP Interconnect 1002 is utilized as an exemplar of any graphics bus; AGP-enabled video controller 1000 is utilized as an exemplar of any video controller; Northbridge 1004 and Southbridge 1022 are utilized as exemplars of any type of bridge; and PCI LAN/modem card 1050 is used is intended to serve as an exemplar of any type of synchronous or asynchronous input-output card. Consequently, as used herein these specific exemplars are intended to be representative of their more general classes. Furthermore, in general, use of any specific exemplar herein is also intended to be representative of its class and the non-inclusion of such specific devices in the foregoing list should not be taken as indicating that limitation is desired.

The foregoing described embodiments depict different components contained within, or connected with, different other components. It is to be understood that such depicted architectures are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such intent is present. For example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements. In addition, even if a specific number of an introduced claim element is explicitly recited, those skilled in the art will recognize that such recitation should typically be interpreted to mean at least the recited number (e.g., the bare recitation of "two elements," without other modifiers, typically means at least two elements, or two or more elements)

What is claimed is:

1. A data processing system comprising:
    a section of a first printed-circuit-board conductive element, said section of the first printed-circuit-board conductive element formed to follow at least one bent segment of a first printed-circuit-board path;
    a section of a second printed-circuit-board conductive element, said section of the second printed-circuit-board conductive element having at least a first part formed to follow at least one bent segment of a second printed-circuit-board path, where the at least one bent segment of the second printed-circuit-board path is substantially proximate to and has a length less than a length of the at least one bent segment of the first printed-circuit-board path; and
    said section of the second printed-circuit-board conductive element having at least a second part formed to follow a conductive-section-equalization feature which deviates from the second printed-circuit-board path, the at least a second part situated substantially proximate to the at least one bent segment of the second printed-circuit-board path and of length sufficient to make a length of said section of the second printed-circuit-board conductive element substantially the same as a length of said section of the first printed-circuit-board conductive element.

2. The data processing system of claim 1, wherein the at least a second part situated substantially proximate to the at least one bent segment of the second printed-circuit-board path further includes:
    the at least a second part situated substantially adjacent to a bend within the at least one bent segment of the second printed-circuit-board path.

3. The data processing system of claim 1, wherein the at least a second part situated substantially proximate to the at least one bent segment of the second printed-circuit-board path further includes:
    the at least a second part situated substantially proximate to a fingerpad which will electrically connect with a connector conductor which follows the at least one bent segment of the second printed-circuit-board path.

4. The data processing system of claim 1, wherein the at least one bent segment of a first printed-circuit-board path further includes:
    the at least one bent segment of the first printed-circuit-board path defined to begin at a start-segment line extending perpendicular to the first printed-circuit-board path and defined to end at an end-segment line extending perpendicular to the first printed-circuit-board path.

5. The data processing system of claim 1, wherein the at least one bent segment of a second printed-circuit-board path further includes:
    the at least one bent segment of the second printed-circuit-board path defined to begin at a start-segment line extending perpendicular to the first printed-circuit-board path and defined to end at an end-segment line extending perpendicular to the first printed-circuit-board path.

6. The data processing system of claim 1, wherein the first printed-circuit-board conductive element is a printed-circuit-board trace.

7. The data processing system of claim 1, wherein the first printed-circuit-board conductive element is a flexible printed-circuit-board trace.

8. The data processing system of claim 1, wherein the first printed-circuit-board conductive element is a printed-circuit-board connector conductor.

9. The data processing system of claim 1, wherein the second printed-circuit-board conductive element is a printed-circuit-board trace.

10. The data processing system of claim 1, wherein the second printed-circuit-board conductive element is a flexible printed-circuit-board trace.

11. The data processing system of claim 1, wherein the second printed-circuit-board conductive element is a printed-circuit-board connector conductor.

12. The data processing system of claim 1, wherein the at least one bent segment of a first printed-circuit-board path further includes:
    a first line segment joined to a second line segment at a point, where the first and second line segment on either side of the point form an angle of less than 180 degrees.

13. The data processing system of claim 12, wherein the first and second line segment on either side of the point form an angle of less than 180 degrees further includes: the first and second line segment on either side of the point form an angle of 90 degrees.

14. The data processing system of claim 1, wherein the at least one bent segment of a first printed-circuit-board path further includes:
    a curved line segment.

15. The data processing system of claim 1, wherein the at least a second part formed to follow a conductive-section-equalization feature further includes:
    the at least a second part formed in a wave-like pattern.

16. The data processing system of claim 1, wherein the at least a second part formed to follow a conductive-section-equalization feature further includes:
   the at least a second part formed in a zigzag pattern.

17. The data processing system of claim 1, wherein the at least a second part formed to follow a conductive-section-equalization feature further includes:
   the at least a second part formed bent and having a direction of bending opposite the direction of bending of the at least one bent segment of the second printed-circuit-board path.

18. The data processing system of claim 17, wherein the at least a second part formed bent further includes:
   a first straight-line printed-circuit-board conductive element portion joined to a second straight-line printed-circuit-board conductive element portion at a point, where the first and second straight-line printed-circuit-board conductive element portions on either side of the point form an angle of less than 180 degrees.

19. The data processing system of claim 18, wherein the first and second straight-line printed-circuit-board conductive element portions on either side of the point form an angle of less than 180 degrees further includes:
   the first and second straight-line printed-circuit-board conductive element portions on either side of the point forming an angle of 90 degrees.

20. The data processing system of claim 17, wherein the at least a second part formed bent further includes:
   a curved printed-circuit-board conductive element portion.

21. The data processing system of claim 1, further comprising:
   a processor and a memory operably connected by said section of the first printed-circuit-board conductive element and said section of the second printed-circuit-board conductive element.

22. A method of manufacturing comprising:
   forming a section of a first printed-circuit-board conductive element to follow at least one bent segment of a first printed-circuit-board path;
   forming a section of a second printed-circuit-board conductive element to have at least a first part shaped to follow at least one bent segment of a second printed-circuit-board path, where the at least one bent segment of the second printed-circuit-board path is substantially proximate to and has a length less than a length of the at least one bent segment of the first printed-circuit-board path; and
   forming the section of the second printed-circuit-board conductive element to have at least a second part shaped to follow a conductive-section-equalization feature which deviates from the second printed-circuit-board path, the at least a second part situated substantially proximate to the at least one bent segment of the second printed-circuit-board path and of length sufficient to make a length of said section of the second printed-circuit-board conductive element substantially the same as a length of said section of the first printed-circuit-board conductive element.

23. The method of claim 22, wherein the at least a second part situated substantially proximate to the at least one bent segment of the second printed-circuit-board path further includes:
   the at least a second part situated substantially adjacent to a bend within the at least one bent segment of the second printed-circuit-board path.

24. The method of claim 22, wherein the at least a second part situated substantially proximate to the at least one bent segment of the second printed-circuit-board path further includes:
   the at least a second part situated substantially proximate to a fingerpad which will electrically connect with a connector conductor which follows the at least one bent segment of the second printed-circuit-board path.

25. The method of claim 22, wherein the at least one bent segment of a first printed-circuit-board path further includes:
   the at least one bent segment of the first printed5 circuit-board path defined to begin at a start-segment line extending perpendicular to the first printed-circuit-board path and defined to end at an end-segment line extending perpendicular to the first printed-circuit-board path.

26. The method of claim 22, wherein the at least one bent segment of a second printed-circuit-board path further includes:
   the at least one bent segment of the second printed-circuit-board path defined to begin at a start-segment line extending perpendicular to the first printed-circuit-board path and defined to end at an end-segment line extending perpendicular to the first printed-circuit-board path.

27. The method of claim 22, wherein the first printed-circuit-board conductive element is a printed-circuit-board trace.

28. The method of claim 22, wherein the first printed-circuit-board conductive element is a flexible printed-circuit-board trace.

29. The method of claim 22, wherein the first printed-circuit-board conductive element is a printed-circuit-board connector conductor.

30. The method of claim 22, wherein the second printed-circuit-board conductive element is a printed-circuit-board trace.

31. The method of claim 22, wherein the second printed-circuit-board conductive element is a flexible printed-circuit-board trace.

32. The method of claim 22, wherein the second printed-circuit-board conductive element is a printed-circuit-board connector conductor.

33. The method of claim 22, wherein the at least one bent segment of a first printed-circuit-board path further includes:
   a first line segment joined to a second line segment at a point, where the first and second line segment on either side of the point form an angle of less than 180 degrees.

34. The method of claim 33, wherein the first and second line segment on either side of the point form an angle of less than 180 degrees further includes:
   the first and second line segment on either side of the point form an angle of 90 degrees.

35. The method of claim 22, wherein the at least one bent segment of a first printed-circuit-board path further includes:
   a curved line segment.

36. The method of claim 22, wherein said forming the section of the second printed-circuit-board conductive element to have at least a second part shaped to follow a conductive-section-equalization feature further includes:
   forming the section of the second printed-circuit-board conductive element to have the at least a second part shaped in a wave-like pattern.

37. The method of claim 22, wherein said forming the section of the second printed-circuit-board conductive element to have at least a second part shaped to follow a conductive-section-equalization feature further includes:

forming the section of the second printed-circuit-board conductive element to have the at least a second part shaped in a zigzag pattern.

38. The method of claim 22, wherein said forming the section of the second printed-circuit-board conductive element to have at least a second part shaped to follow a conductive-section-equalization feature further includes:

forming the section of the second printed-circuit-board conductive element to have the at least a second part shaped bent and having a direction of bending opposite the direction of bending of the at least one bent segment of the second printed-circuit-board path.

39. The method of claim 38, wherein said forming the section of the second printed-circuit-board conductive element to have the at least a second part shaped bent further includes:

forming a first straight-line printed-circuit-board conductive element portion joined to a second straight-line printed-circuit-board conductive element portion at a point, where the first and second straight-line printed-circuit-board conductive portions on either side of the point form an angle of less than 180 degrees.

40. The method of claim 39, wherein the first and second straight-line printed-circuit-board conductive portions on either side of the point form an angle of less than 180 degrees further includes:

the first and second straight-line printed-circuit-board conductive portions on either side of the point forming an angle of 90 degrees.

41. The method of claim 38, wherein said forming the section of the second printed-circuit-board conductive element to have the at least a second part shaped bent further includes:

forming a curved printed-circuit-board conductive element portion.

42. A method comprising:

operably connecting a processor and a memory operably connected by said section of the first printed-circuit-board conductive element and said section of the second printed-circuit-board conductive element of claim 1.

* * * * *